United States Patent
Satoh et al.

(10) Patent No.: US 7,447,617 B2
(45) Date of Patent: Nov. 4, 2008

(54) DATA PROCESSING DEVICE DESIGNING METHOD, DATA PROCESSING DEVICE DESIGNING APPARATUS, PROGRAM AND COMPUTER READABLE INFORMATION RECORDING MEDIUM

(75) Inventors: Masaoki Satoh, Yokohama (JP); Takeshi Toyoyama, Yokohama (JP); Satoshi Aoki, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 566 days.

(21) Appl. No.: 11/018,964

(22) Filed: Dec. 22, 2004

(65) Prior Publication Data
US 2005/0187750 A1 Aug. 25, 2005

(30) Foreign Application Priority Data
Feb. 25, 2004 (JP) ............................. 2004-049955

(51) Int. Cl.
G06F 17/50 (2006.01)
(52) U.S. Cl. ....................................................... 703/14
(58) Field of Classification Search .................. 703/14, 703/13; 712/34; 714/16
See application file for complete search history.

(56) References Cited
U.S. PATENT DOCUMENTS

| 5,832,202 | A | * | 11/1998 | Slavenburg et al. ........... 714/16 |
| 7,228,262 | B2 | * | 6/2007 | Anzou et al. ................... 703/14 |
| 2001/0005880 | A1 | * | 6/2001 | Ando ........................... 712/34 |

FOREIGN PATENT DOCUMENTS

| JP | 4-199439 | 7/1992 |
| JP | 2000-187675 | 7/2000 |
| JP | 2000-305967 | 11/2000 |
| JP | 2002-269163 | 9/2002 |

OTHER PUBLICATIONS

Eunmi et al., C. An Important Factor for Optimistic Protocol on Distributed Systems: Granularity, IEEE Winter Simulation Conference, Dec. 1995, pp. 642-649.*
Chung et al., M. An Overhead Reducing Technique for Time Warp, Sixth IEEE Workshop on Distributed Simulation and Real-Time Applications, Oct. 2002, pp. 95-102.*

(Continued)

Primary Examiner—Russell Frejd
(74) Attorney, Agent, or Firm—Hanify & King, P.C.

(57) ABSTRACT

A method includes steps of calculating, for each predetermined operation included in a program, an execution time required when the operation is executed by a predetermined processor, or calculating, for each predetermined operation included in the program, a circuit size required when the operation is realized in a form of hardware according to a predetermined technology; and calculating, for the entirety of the predetermined program or operations corresponding to a part the entirety of the predetermined program, a total execution time required when the entirety of the predetermined program is executed by the predetermined processor, as a result of applying in sequence the required execution time, or calculating, for the entirety of the predetermined program or operations corresponding to a part the entirety of the predetermined program, a total circuit size required when the entirety of the predetermined program or programs corresponding to a part of the entirety of the predetermined program, as a result of applying in sequence the required circuit size.

8 Claims, 17 Drawing Sheets

OTHER PUBLICATIONS

Obermeier, F. A Model Generation and Compilation System for Improving Electrical Performance, IEEE Symposium on Circuits and Systems, May 1990, pp. 852-855.*

Jayabharathi et al., R. A Novel Solution for Chip-Level Functional Timing Verification, 15th IEEE VLSI Test Symposium, Apr.-May 1997, pp. 137-142.*

* cited by examiner

FIG.3

| LINE NUMBER | PROGRAM |
|---|---|
| 1 | void sample1(const int& a, int& b, int& c, int& d, const int& e, const int& f) |
| 2 | { |
| 3 | if(a == 0){ |
| 4 | b = 0; |
| 5 | c = 0; |
| 6 | } |
| 7 | else{ |
| 8 | b = 1; |
| 9 | c++; |
| 10 | |
| 11 | if(c >= 9){ |
| 12 | c = 9; |
| 13 | } |
| 14 | |
| 15 | |
| 16 | if(b == 0){ |
| 17 | d = e + f; |
| 18 | } |
| 19 | else{ |
| 20 | d = e * f; |
| 21 | } |
| 22 | } |

FIG.5A

'A' COMPANY PROCESSOR A1

| OPERATION | EXECUTION CYCLE |
|---|---|
| int == const | 3 |
| int >= const | 4 |
| int <= const | 4 |
| int ++ | 2 |
| int -- | 2 |
| int = int + int | 2 |
| int = int - int | 4 |
| int = int * int | 16 |
| int = int / int | 1 |
| int = const | ........ |

FIG.5B

'B' COMPANY PROCESSOR B1

| OPERATION | EXECUTION CYCLE |
|---|---|
| int == const | 4 |
| int >= const | 5 |
| int <= const | 5 |
| int ++ | 1 |
| int -- | 1 |
| int = int + int | 1 |
| int = int - int | 6 |
| int = int * int | 20 |
| int = int / int | 1 |
| int = const | ........ |

FIG.5C

'C' COMPANY PROCESSOR C1

| OPERATION | EXECUTION CYCLE |
|---|---|
| int == const | 4 |
| int >= const | 4 |
| int <= const | 4 |
| int ++ | 2 |
| int -- | 2 |
| int = int + int | 2 |
| int = int - int | 6 |
| int = int * int | 6 |
| int = int / int | 1 |
| int = const | ........ |

FIG.6

| LINE NUMBER | PROGRAM |
|---|---|
| 1 | void sample1(const int& a, int& b, int& c, int& d, const int& e, const int& f) |
| 2 | { |
| 3 | if(a == 0){ |
| 4 | asm("my_comment01"); |
| 5 | } |
| 6 | b = 0; |
| 7 | c = 0; |
| 8 | |
| 9 | if(b == 0){ |
| 10 | asm("my_comment02"); |
| 11 | } |
| 12 | d = e + f; |
| 13 | } |

FIG.8A

'A' COMPANY 0.18 μm TECHNOLOGY

| OPERATION | CIRCUIT SIZE |
|---|---|
| FF | 10 |
| int == const | 300 |
| int >= const | 400 |
| int <= const | 400 |
| int ++ | 200 |
| int -- | 200 |
| int = int + int | 200 |
| int = int - int | 200 |
| int = int * int | 400 |
| int = int / int | 1600 |
| ......... | ......... |

('A' COMPANY 0.25 μm TECHNOLOGY, 'A' COMPANY 0.35 μm TECHNOLOGY)

FIG.8B

'B' COMPANY 0.18 μm TECHNOLOGY

| OPERATION | CIRCUIT SIZE |
|---|---|
| FF | 8 |
| int == const | 400 |
| int >= const | 500 |
| int <= const | 500 |
| int ++ | 100 |
| int -- | 100 |
| int = int + int | 100 |
| int = int - int | 100 |
| int = int * int | 600 |
| int = int / int | 2000 |
| ......... | ......... |

('B' COMPANY 0.25 μm TECHNOLOGY)

FIG.8C

'C' COMPANY 0.13 μm TECHNOLOGY

| OPERATION | CIRCUIT SIZE |
|---|---|
| FF | 5 |
| int == const | 40 |
| int >= const | 40 |
| int <= const | 40 |
| int ++ | 20 |
| int -- | 20 |
| int = int + int | 20 |
| int = int - int | 20 |
| int = int * int | 60 |
| int = int / int | 60 |
| ......... | ......... |

('C' COMPANY 0.18 μm TECHNOLOGY, 'C' COMPANY 0.25 μm TECHNOLOGY, 'C' COMPANY 0.35 μm TECHNOLOGY)

FIG.12A

| SUB-PROGRAM 1002 | |
|---|---|
| 'A' COMPANY PROCESSOR A1 | 3000 CYCLES |
| 'A' COMPANY 0.18 μm TECHNOLOGY | 10000 GATES |

FIG.12B

| SUB-PROGRAM 1003 | |
|---|---|
| 'A' COMPANY PROCESSOR A1 | 6000 CYCLES |
| 'A' COMPANY 0.18 μm TECHNOLOGY | 22000 GATES |

FIG.12C

| SUB-PROGRAM 1006 | |
|---|---|
| 'A' COMPANY PROCESSOR A1 | 5000 CYCLES |
| 'A' COMPANY 0.18 μm TECHNOLOGY | 5000 GATES |

FIG.13

| SOFTWARE EXECUTION TIME | NOT MORE THAN 10000 CYCLES |
|---|---|
| HARDWARE CIRCUIT SIZE | NOT MORE THAN 30000 GATES |

FIG.14

| SUB-PROGRAM | 1002 | 1003 | 1006 |
|---|---|---|---|
| 'A' COMPANY PROCESSOR A1 | 3000 CYCLES | 6000 CYCLES | 5000 CYCLES |
| 'A' COMPANY 0.18 μm TECHNOLOGY | 10000 GATES | 22000 GATES | 5000 GATES |

FIG.15

| SUB-PROGRAM | | | PERFORMANCE EVALUATION RESULT | |
|---|---|---|---|---|
| | | | 'A' COMPANY PROCESSOR A1 | 'A' COMPANY 0.18 μm TECHNOLOGY |
| 1002 | 1003 | 1006 | EXECUTION TIME (CYCLES) | CIRCUIT SIZE (GATES) |
| SOFT WARE | SOFT WARE | SOFT WARE | 3000+6000+5000=14000 | 0+ 0+ 0= 0 |
| SOFT WARE | SOFT WARE | HARD WARE | 3000+6000+ 0= 9000 | 0+ 0+5000=5000 |
| SOFT WARE | HARD WARE | SOFT WARE | 3000+ 0+5000= 8000 | 0+22000+ 0=22000 |
| SOFT WARE | HARD WARE | HARD WARE | 3000+ 0+ 0= 3000 | 0+22000+5000=27000 |
| HARD WARE | SOFT WARE | SOFT WARE | 0+6000+5000=11000 | 10000+ 0+ 0=10000 |
| HARD WARE | SOFT WARE | HARD WARE | 0+6000+ 0= 6000 | 10000+ 0+5000=15000 |
| HARD WARE | HARD WARE | SOFT WARE | 0+ 0+5000= 5000 | 10000+22000+ 0=32000 |
| HARD WARE | HARD WARE | HARD WARE | 0+ 0+ 0= 0 | 10000+22000+5000=37000 |

▨ COMBINATION FULFILLING RESTRICTIONS

FIG.16

HARDWARE/SOFTWARE ANALYSIS RESULT

| SUB-PROGRAM 1002 | |
|---|---|
| 'B' COMPANY PROCESSOR B2 | 2000 CYCLES |
| 'A' COMPANY 0.18 $\mu$m TECHNOLOGY | 10000 GATES |

| SUB-PROGRAM 1003 | |
|---|---|
| 'B' COMPANY PROCESSOR B2 | 5000 CYCLES |
| 'A' COMPANY 0.18 $\mu$m TECHNOLOGY | 22000 GATES |

| SUB-PROGRAM 1006 | |
|---|---|
| 'B' COMPANY PROCESSOR B2 | 4000 CYCLES |
| 'A' COMPANY 0.18 $\mu$m TECHNOLOGY | 5000 GATES |

FIG.17

HARDWARE/SOFTWARE RESTRICTION

| SOFTWARE EXECUTION TIME | NOT MORE THAN 8000 CYCLES |
|---|---|
| HARDWARE CIRCUIT SIZE | NOT MORE THAN 25000 GATES |

FIG.18

PERFORMANCE EVALUATION SUMMARY

| SUB-PROGRAM | 1002 | 1003 | 1006 |
|---|---|---|---|
| 'B' COMPANY PROCESSOR B2 | 2000 CYCLES | 5000 CYCLES | 4000 CYCLES |
| 'A' COMPANY 0.18 μm TECHNOLOGY | 10000 GATES | 22000 GATES | 5000 GATES |

FIG.19

PERFORMANCE FULFILLMENT EVALUATION

| SUB-PROGRAM | | | PERFORMANCE EVALUATION RESULT | |
|---|---|---|---|---|
| 1002 | 1003 | 1006 | 'B' COMPANY PROCESSOR B2 EXECUTION TIME (CYCLES) | 'A' COMPANY 0.18 μm TECHNOLOGY CIRCUIT SIZE (GATES) |
| SOFT WARE | SOFT WARE | SOFT WARE | 2000+5000+4000=11000 | 0+ 0+ 0= 0 |
| SOFT WARE | SOFT WARE | HARD WARE | 2000+5000+ 0= 7000 | 0+ 0+5000=5000 |
| SOFT WARE | HARD WARE | SOFT WARE | 2000+ 0+4000= 6000 | 0+22000+ 0=22000 |
| SOFT WARE | HARD WARE | HARD WARE | 2000+ 0+ 0= 2000 | 0+22000+5000=27000 |
| HARD WARE | SOFT WARE | SOFT WARE | 0+5000+4000= 9000 | 10000+ 0+ 0=10000 |
| HARD WARE | SOFT WARE | HARD WARE | 0+5000+ 0= 5000 | 10000+ 0+5000=15000 |
| HARD WARE | HARD WARE | SOFT WARE | 0+ 0+4000= 4000 | 10000+22000+ 0=32000 |
| HARD WARE | HARD WARE | HARD WARE | 0+ 0+ 0= 0 | 10000+22000+5000=37000 |

 COMBINATION FULFILLING RESTRICTIONS

DATA PROCESSING DEVICE DESIGNING METHOD, DATA PROCESSING DEVICE DESIGNING APPARATUS, PROGRAM AND COMPUTER READABLE INFORMATION RECORDING MEDIUM

BACKGROUND OF THE INVENTION

1. Field of the Invention

The present invention relates to a data processing device designing method, a data processing device designing apparatus, a program and a computer readable information recording medium, and, in particular, to a data processing device designing method, a data processing device designating apparatus, a program and a computer readable information recording medium for designing a data processing device from a predetermined program.

2. Description of the Related Art

Generally, when a data processing device having predetermined functions is designed, a program for carrying out the functions is produced first, and then, a circuit designing is carried out to produce the data processing device having the functions same as those which the program has. In this case, it is possible to configure the data processing device in which the predetermined program in a form of software as it is executed by a predetermined processor. Alternatively, it is also possible to create the data processing device in a form of hardware for carrying out the processing functions of the program according to a predetermined hardware technology. Upon comparing both ways, it is possible to reduce a required execution time in the latter case in which the functions are realized in a form of hardware. On the other hand, in the former case in which the functions are executed as a result of the program in a form of software as it is executed by a processor, it is possible to miniaturize a required circuit size of hardware in a final product even though a required execution time is relatively long. Therefore, generally, both ways are combined in an appropriately rate in a data processing device in consideration of tradeoff therebetween. For this purpose, an execution time required when the predetermined program in a form of software is executed by a processor and a circuit size required when the processing functions of the program are realized in a form of hardware are calculated, and, based on the calculation results, study is carried out as to how the relevant processing functions are divided into a part realized in a form of software and the other part realized in a form of hardware. In other words, study is carried out as to divide the processing functions (specifications) of the entirety of a desired system into a first part which is realized in a form of software program to be executed by a processor and a second part functions of which are realized in a form of hardware such as an ASIC. Such an operation of dividing the required processing functions is referred to as 'software/hardware function dividing', hereinafter.

A system which is widely used in a cellular phone or such is a so-called include system which includes a part in a form of software and a part in a form of hardware, and, specifically, is made from a processor, a memory, an ASIC and so forth. When such an include system is designed, it is necessary to carry out various sorts of selection operations, i.e., to select a processor, a hardware technology or such. Such selection operations are referred to as 'processor/technology selection', hereinafter.

At a time of processor/technology selection, generally speaking, design restrictions (requirements) are given, i.e., a required execution time for a part of processing functions which is realized in a form of software as a program to be executed by a processor, a required circuit size of the other part functions of which are realized in a form of hardware such as an ASIC, or such. It is necessary to carry out the processor/technology selection fulfilling these design restrictions (requirements). Further, in such a case, it is also necessary to carry out the processor/technology selection with totally taking into account of given development period, development costs or such. Conventionally, in general, the processor/technology selection is carried out relying upon experience or intuition of an expert who has a superior technique, and after that, the software/hardware function dividing is carried out to divide the processing functions of the entire system in such a manner to fulfill the given design restrictions.

At a time of the software/hardware function dividing, a designer should divide the processing functions of the system in such a manner to fulfill the given design restrictions (the given required execution time for the part realized in a form of software of a program executed by a processor, the given required circuit size for the part functions of which are realized in a form of hardware such as an ASIC, or such). According to the prior art such as that disclosed by Japanese Laid-open Patent Application No. 4-199439, the required execution time for the part realized in a form of software of a program executed by a processor is calculated in such a manner that a structure of the given program including a plurality of instructions is analyzed and possible processing paths are determined therefrom; execution contents of the program are analyzed for each of the thus-determined processing paths; and an execution time is automatically calculated for each of the processing paths. Furthermore, conventionally, the required circuit size for the part functions of which are realized in a form of hardware such as an ASIC is calculated in such a manner that hardware is actually generated by means of a so-called function compiling tool which is software prepared for generating hardware from a give program, and the thus-generated hardware is used to calculate the circuit size.

Further, conventionally, for the part to be realized in a form of software program carried out by a processor, generally speaking, after the processor/technology selection and the software/hardware function dividing are determined, simulation is carried out with the use of a so-called instruction set simulator prepared for the target processor, thereby the required execution time is obtained with higher accuracy, and based thereon, the program is tuned if necessary. In this case, in order to calculate the required execution time of the program in the simulation, test data should be prepared with which the program may be executed in such a manner that the execution time may become maximum. Also in this case, conventionally, a processing path such that therein the program may be executed in such a manner that the execution time may become maximum is extracted relying upon experience or intuition of an expert, and the test data is produced with which the program is executed in the thus-specified processing path.

SUMMARY OF THE INVENTION

In order to achieve efficient designing of a data processing device, the above-mentioned processor/technology selection and software/hardware function dividing should be carried out in parallel. However, conventionally, the processor/technology selection is carried out relying upon experience or intuition of an expert, and, after that, the software/hardware function dividing is carried out to divide the processing functions of the entire system in such a manner that the design fulfilling the predetermined design restrictions may be achieved. However, for example, the system of a cellular phone has increased in the size and complicated in the contents recently, and thus, even the expert may not select an optimum processor or an optimum hardware technology therefor. In particular, when no solution is obtained to fulfill the predetermined design restrictions, the processor/technology selection should be carried out again. As a result, the required development period may increase, or the required development costs may increase accordingly.

According to the above-mentioned Japanese Laid-open Patent Application No. 4-199439, when the required execution time of the part realized in a form of software of a program executed by a processor is calculated, 'a program made from a plurality of instructions' should be input first. Since this program made from a plurality of instructions is specialized for the particular processor, it is necessary to modify the program when the required execution time is calculated again for a case where another processor should be applied for executing the same processing functions. Therefore, it may become difficult to rapidly carry out comparison in the required execution times between respective cases where different processors are applied. As a result, it may be difficult to carry out in parallel both the processor/technology selection and the software/hardware function dividing.

Further, since the above-mentioned function compiling tool used for calculating a circuit size of the part functions of which are realized in a form of hardware such as an ASIC is a tool which is prepared for generating actual hardware, many restrictions exist when such a tool is used, in general. As one of the restrictions, the target program should be rewritten into a description specialized for the applicable function compiling tool. That is, in general, it is not possible to describe operations of hardware in C language when the original specifications of the C language are applied as they are. Therefore, it is necessary to describe the specifications of the C language in SystemC language or such, where predetermined functions are added so that operations of hardware may be described. As a result, when a circuit is designed from many given programs, it is necessary to modify the language to specialize it for the applicable tool, at each time. As a result, it is not possible to calculate the circuit size rapidly. Further, it is not possible to rapidly carry out comparison in the circuit sizes between respective cases where different hardware technologies are applied. Therefore, it may become difficult to carry out the processor/technology selection and software/hardware function dividing in parallel.

Furthermore, when the required execution time of the program is calculated in simulation as mentioned above, the test data such that, therewith the program may be executed in such a manner that the required execution time may become maximum should be produced. However, as mentioned above, the system of a cellular phone or such has increased in the size and complicated in the contents recently. As a result, the program required therefor has become increased in the size and complicated in the contents accordingly. As a result, it may be difficult to extract a processing path such that, therewith the program may be executed in such a manner that the required execution time may become maximum, or a very large time may be required for extracting the same. Accordingly, it may become difficult to produce the test data such that, therewith the program may be executed in such a manner that the required execution time may become maximum with high quality. As a result, it may not be possible to calculate the execution time in simulation rapidly.

The present invention has been devised in consideration of the above-mentioned problems. According to the present invention, previously a calculation is made, for each predetermined operation included in a given program, to obtain an execution time required when the operation is executed by a predetermined processor, or a calculation is made to obtain, for each predetermined operation included in the program, a circuit size required when the operation is realized in a form of hardware according to a predetermined hardware technology. Then, a calculation is made, for the entirety of the predetermined program or operations corresponding to a part the entire predetermined program, a total execution time required when the entire predetermined program is executed by the predetermined processor, as a result of applying in sequence the required execution time calculated previously for each predetermined operation as mentioned above, or a calculation is made to obtain, for the entire predetermined program or operations corresponding to a part the entire predetermined program, a total circuit size required when the entire predetermined program or operations corresponding to a part of the entire predetermined program, as a result of applying in sequence the required circuit size calculated previously for each predetermined operation as mentioned above.

Thereby, the required execution time or the required circuit size is easily calculated for the entirety of the given program Further, by applying this concept, it is possible to easily calculate the required execution time and the required circuit size for the entirety of the program finally after the program is divided, i.e., after the above-mentioned software/hardware function dividing is carried out, for respective sub-programs included therein, into a part realized in a form of software to be executed by a processor and a part functions of which are realized in a form of hardware such as an ASIC.

Similarly, as mentioned above, the required execution time may be calculated for each particular processor for each operation, or, the required circuit size may be calculated for each particular hardware technology for each operation. Thereby, it is possible to easily carry out a comparison in the required execution times or the required circuit sizes between respective cases where different processors are applied or between respective cases where different hardware technologies are applied. As a result, it is possible to carry out the processor/technology selection and the software/hardware function dividing in parallel, and, as a result, it is possible to carry out the processor/technology selection and the software/hardware function dividing appropriately, rapidly, with high accuracy.

It is noted that, when the circuit size is calculated for a case where functions of the given program are realized in a form of hardware according to a predetermined hardware technology, it is preferable to calculate the circuit size in consideration of the contents of a variable corresponding to an output for each operation included in the program. As a result, it is possible to calculate the required circuit size with higher accuracy.

Further, it is preferable to previously carry out operation to determine a processing path such that therewith the program may be executed in such a manner that the maximum required execution time may be taken, when the required execution time should be previously calculated for each operation as mentioned above. Then, by utilizing this determination result, it is possible to edit the input program to generate a program such that the program may be executed in the processing path resulting in that the maximum required execution time is taken. Then, with the use of the thus-obtained edited program, it becomes possible to easily calculate the required execution time in simulation. Further, by utilizing the above-mentioned determining result, it is also possible to easily generate test data (input data) such that therewith the program may be executed in the processing path resulting in that the maximum required execution time may be taken. Then, by utilizing such test data, it is also possible to calculate the required execution time in simulation of the program.

Thus, according to the present invention, it becomes possible to carry out the processor/technology selection and the software/hardware function dividing for a given program appropriately, rapidly, with high accuracy, and, as a result, it is possible to carry out design of an even large-scaled data processing device efficiently.

Other objects and further features of the present invention will become more apparent from the following detailed description when read in conjunction with the accompanying drawings:

BRIEF DESCRIPTION OF THE DRAWINGS

FIG. 3 shows one example of an input program for the software/hardware performance evaluation part in the data processing device designing apparatus according to the embodiment of the present invention;

FIGS. 5A, 5B and 5C illustrate examples of required execution time data for each type of operation registered, for each particular applicable processor, in a processor selection part of the software/hardware performance evaluation part in the data processing device designing apparatus according to the embodiment of the present invention;

FIG. 6 shows one example of a program obtained from the input program shown in FIG. 3 as a result of it being edited by a program editing part in the data processing device designing apparatus according to the embodiment of the present invention;

FIGS. 8A, 8B and 8C illustrate examples of required circuit size data for each variable corresponding to an output, for each operation, stored, for each particular applicable hardware technology, in a technology selection part of the software/hardware performance evaluation part in the data processing device designing apparatus according to the embodiment of the present invention;

FIGS. 12A, 12B and 12C illustrate respective values of the required execution time and the required circuit size calculated, for each sub-program shown in FIG. 10, by the software/hardware performance evaluation part in the data processing device designing apparatus according to the embodiment of the present invention;

FIG. 13 shows one example of given restriction requirements of the respective values of the required execution time and the required circuit size input to a restriction input part shown in FIG. 2;

FIG. 14 shows a summary of the results shown in FIGS. 12A-12C;

FIG. 15 shows a software/hardware function dividing plan (a part enclosed by hatching) fulfilling the restriction requirements shown in FIG. 13 obtained by a dividing calculation part shown in FIG. 2, based on the result shown in FIG. 14;

FIG. 16 illustrates, for a case of applying other processor/technology, respective values of the required execution time and the required circuit size calculated, for each sub-program shown in FIG. 10, by the software/hardware performance evaluation part in the data processing device designing apparatus according to the embodiment of the present invention;

FIG. 17 shows, for the case of applying other processor/technology, one example of given restriction requirements of the respective values of the required execution time and the required circuit size input to a restriction input part shown in FIG. 2;

FIG. 18 shows a summary of the results shown in FIG. 16; and

FIG. 19 shows a software/hardware function dividing plan (a part enclosed by hatching) fulfilling the restriction requirements shown in FIG. 13 obtained by a dividing calculation part shown in FIG. 2, based on the result shown in FIG. 18.

DETAILED DESCRIPTION OF THE PREFERRED EMBODIMENT

Figure 1:
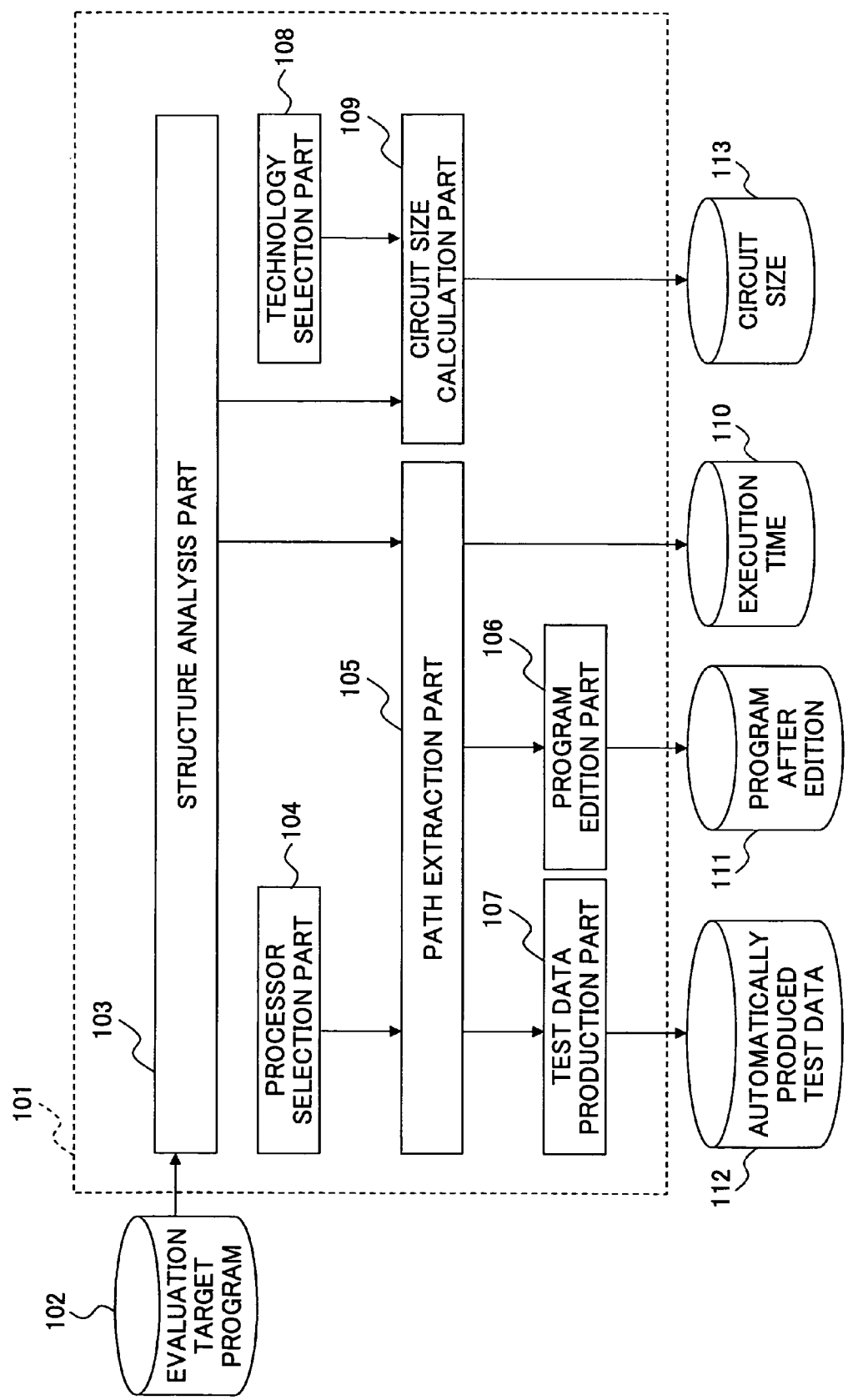
FIG. 1 shows a block diagram of a software/hardware performance evaluation part in a data processing device designing apparatus according to one embodiment of the present invention.

According to an embodiment of the present invention, (1) when an execution time for a part realized in a form of software as a program to be executed by a processor is calculated, a program is input, not as 'a program made from a plurality of instructions' but as 'a program made from operations such as plurality of conditional statements or assignment statements'. Further, a plurality of sorts of 'data including various sorts of operations appearing in conditional statements or assignment statements of a program, and execution times required for executing these operations, respectively' are previously prepared. As a result, it becomes possible to carry out rapidly a comparison in the required execution times among respective cases where a plurality of different processors are applied without actually modifying the program to one specialized for each particular processor.

Furthermore, according to the present invention, (2) for the purpose of calculating a circuit size for a part of the given program functions of which are realized in a form of hardware such as an ASIC, a plurality of sorts of 'circuit size data required when a relevant operation and a variable corresponding to an output of the operation are realized in a form of hardware, for various sorts of operations and variables corresponding to outputs thereof appearing in conditional statements or assignment statements of a program' is prepared. As a result, it becomes possible to carry out rapidly circuit size calculation without actually modifying the given program to one of description specialized to a particular function compiling tool. Thereby, it becomes possible to rapidly carry out a comparison of the circuit sizes among respective cases of a plurality of different technologies are applied.

Furthermore, as a result of (1) preparing a plurality of sorts of 'data including various sorts of operations appearing in conditional statements or assignment statements of a program, and execution times required for executing these operations, respectively' and preparing (2) a plurality of sorts of 'circuit size data required when a relevant operation and a variable corresponding to an output of the operation are realized in a form of hardware, for various sorts of operations and variables corresponding to outputs thereof appearing in conditional statements or assignment statements of a program', as mentioned above, it becomes possible to carry out the processor/technology selection and the software/hardware function dividing in parallel even in designing of the above-mentioned include system or such.

Further, an input program is edited so that the execution time obtained in the above-mentioned (1) execution time calculation for a case of applying a processing path such that therein the execution time may become maximum may be taken. Then, simulation is carried out with the use of the thus-obtained edited program, and as a result, it becomes possible to calculate the execution time. Thus, since it is not necessary to actually produce test data, it is possible to calculate the execution time in simulation easily.

Alternatively, test data may be obtained as a result of input data being automatically generated such that therewith the program may be executed in a processing path where the execution time obtained in the above-mentioned (1) execution time calculation becomes maximum. Then, with the use of the thus-obtained test data, calculation of the execution time in simulation can be carried out rapidly. In this case, unlike the above-mentioned case, the input program is not edited, and simulation is carried out with the original input program. As a result, it is possible to calculate the execution time with higher accuracy in this case.

The embodiment of the present invention is described next in detail.

FIG. 1 shows a block diagram partially showing a data processing device designing apparatus according to the embodiment of the present invention. The data processing device designing apparatus in the embodiment includes a software/hardware performance evaluation part 101 which receives processing functions of a system for which circuit deign is carried out, input in a form of a program described in a C language or such by a designer, and automatically calculates a required execution time for a case where the processing functions are realized in a form of software as a program executed by a processor; and a required circuit size for a case where the same are realized in a form of hardware such as an ASIC.

In the figure, a structure analysis part 103 receives a program 102 to be evaluated, produced by a user, and is input through an input device (not shown) such as a keyboard, and analyses it for a structure thereof. A processor selection part 104 selects a processor applied as a target currently from among previously registered plurality of processors, according to input operation of the user made on the input device such as a keyboard. A path extraction part 105 receives a structure analysis result from the structure analysis part 103 and a selection result from the processor selection part 104, extracts a path (referred to as a 'required execution time maximizing path', hereinafter) such that therein the program may be executed in such a manner that the required execution time may become maximum, and displays the result (execution time 110) on an output device such as a display device or such (not shown).

A program editing part 106 edits the above-mentioned program in such a manner that the program may be executed in such a manner that the required execution time maximizing path extracted in the path extraction part 05 may be passed through, and thus, the maximum execution time may be taken, and displays the result (edited program 111) on the output device such as a display device or such (not shown).

A test data generation part 107 automatically generates input data such that therewith the program may be executed in such a manner that the required execution time maximizing path extracted in the path extraction part 05 may be passed through, and displays the result (automatically generated test data 112) on the output device such as a display device or such (not shown).

A technology selection part 108 is used to select a hardware technology used as a target currently from among previously registered technologies of hardware as a result of the user inputting an instruction therefor through the input device such as a mouse (not shown). A circuit size calculation part 109 receives the structure analysis result from the structure analysis part 103 and the technology selection result from the technology selection part 108 input thereto, calculates a required circuit size, and displays the calculation result (circuit size 113) on the output device such as a display device.

Figure 2:
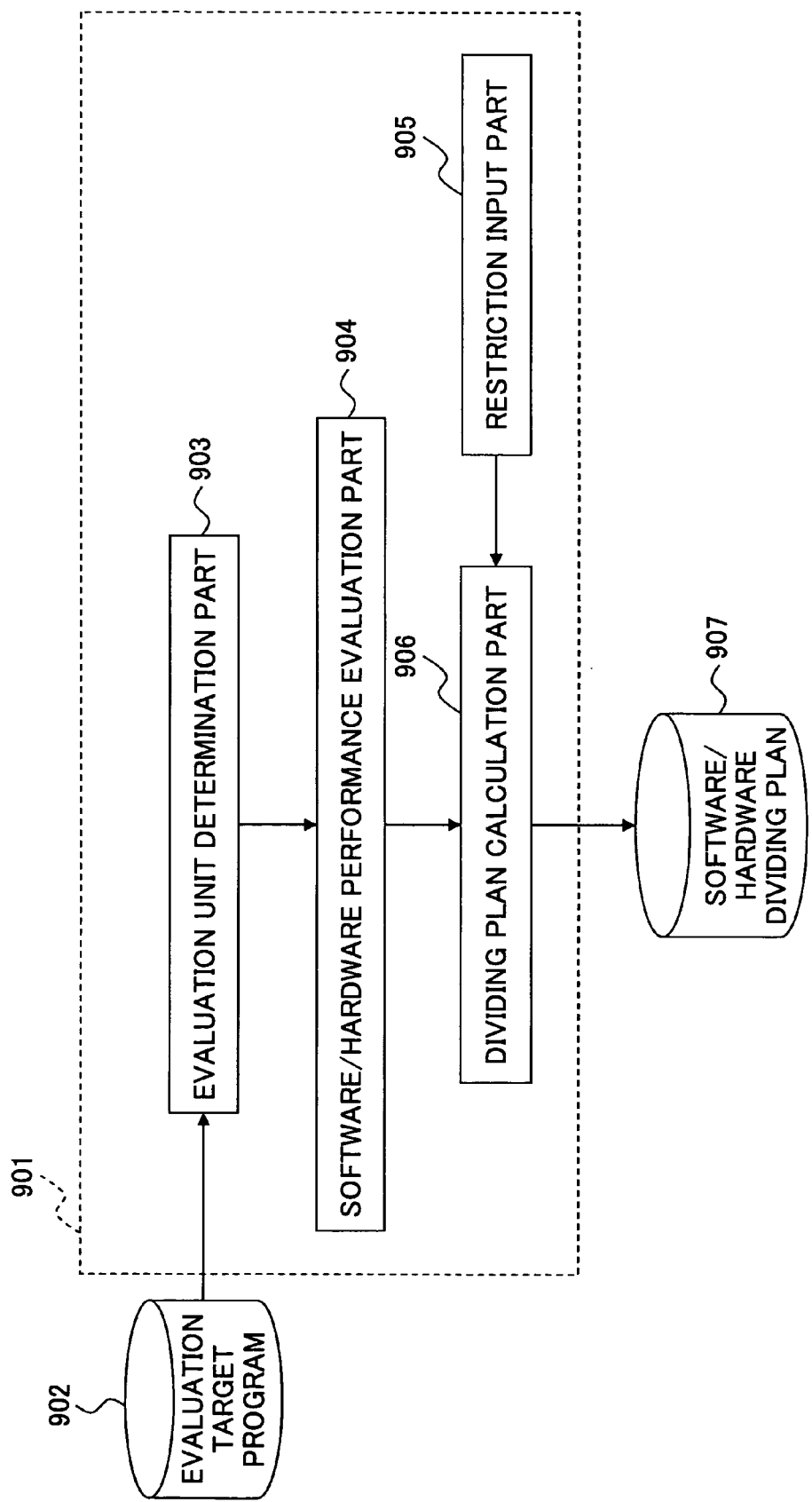
FIG. 2 shows an entire block diagram of the data processing device designing apparatus according to the embodiment of the present invention.

FIG. 2 shows a block diagram of the entirety of the data processing device designing apparatus according to the embodiment of the present invention. This apparatus 901 has functions of aiding user's designing operation, including function of dividing processing functions of a desired system for which circuit designing is carried out in a form of a program described in a C language or such into software and hardware.

The data processing device deigning apparatus 901 includes an evaluation unit determination part 903, a software/hardware performance evaluation part 904, a dividing plan calculation part 906 and a restriction input part 905, as shown.

In the evaluation unit determination part 903, a program 902 to be evaluated is input via an input device such as a keyboard (not shown), and a structure of the input program 902 is analyzed. Then, from the analysis result, the user determines a program unit (evaluation unit; for example, 'sub-program'), the pogrom being then actually input to the software/hardware performance evaluation part 904 in each of the thus-determined program units. The software/hardware performance evaluation part 904 corresponds to the software/hardware performance evaluation part 101 shown in FIG. 1, and carries out performance evaluation of the input program for each of the program unit determined via the evaluation unit determination part 903.

With the use of the restriction input part 905, the user inputs, for the above-mentioned system for which a circuit design is carried out, a restriction of the required execution time of a part realized in software as a program executed by a processor and a restriction of the required circuit size of a part functions of which are realized in a form of hardware such as an ASIC, via the input device such as a keyboard. The dividing plan calculation part 906 summarizes performance evaluation results obtained from the software/hardware performance evaluation part 904, extracts a software/hardware function dividing plan fulfilling the restrictions given via the restriction input part 905, and displays the result (software/hardware function dividing plan 907) on the output device such as a display device (not shown).

Figure 4:
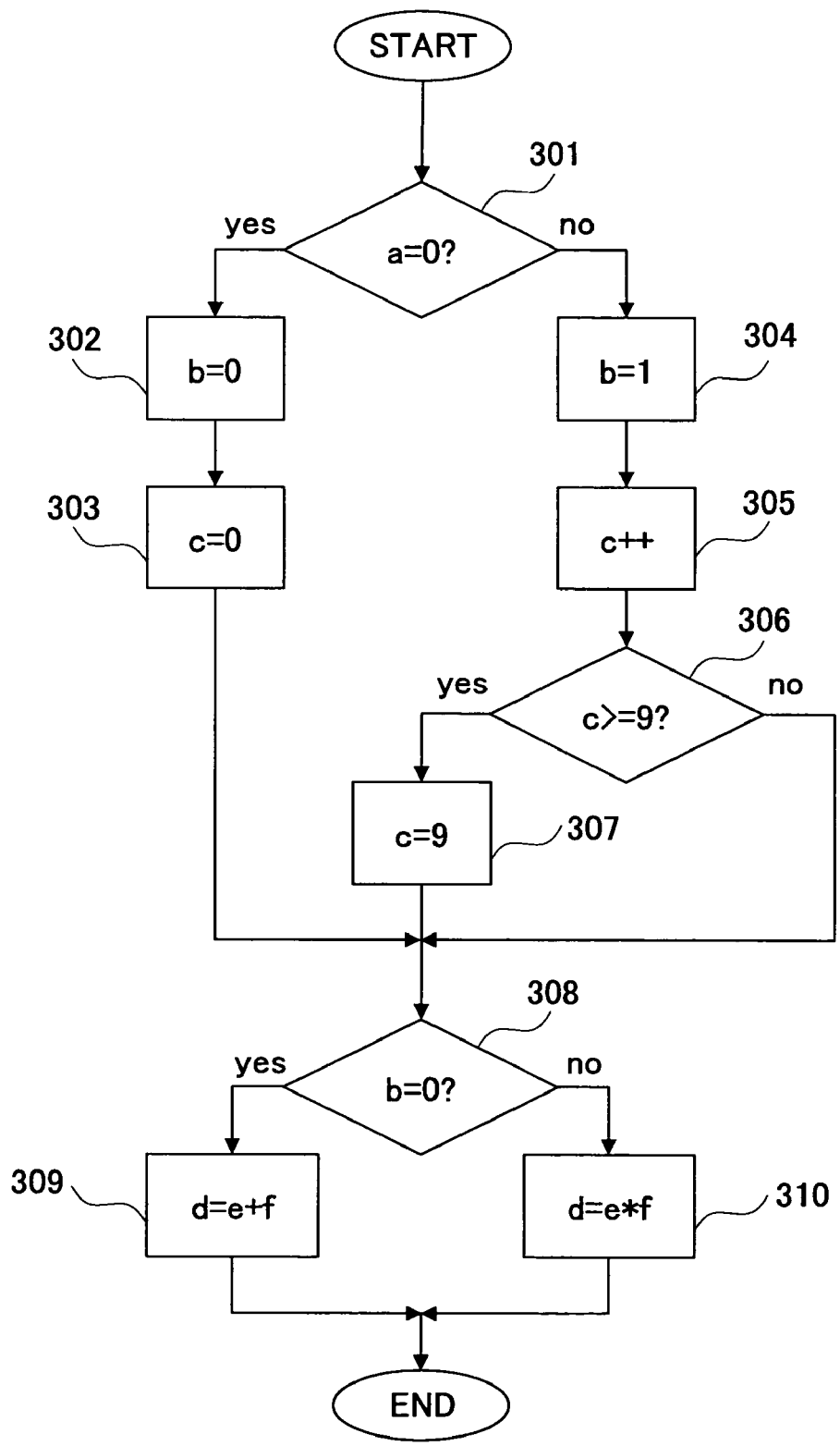
FIG. 4 shows one example of the input program shown in FIG. 3 in a form of a flow chart.
Figure 7:
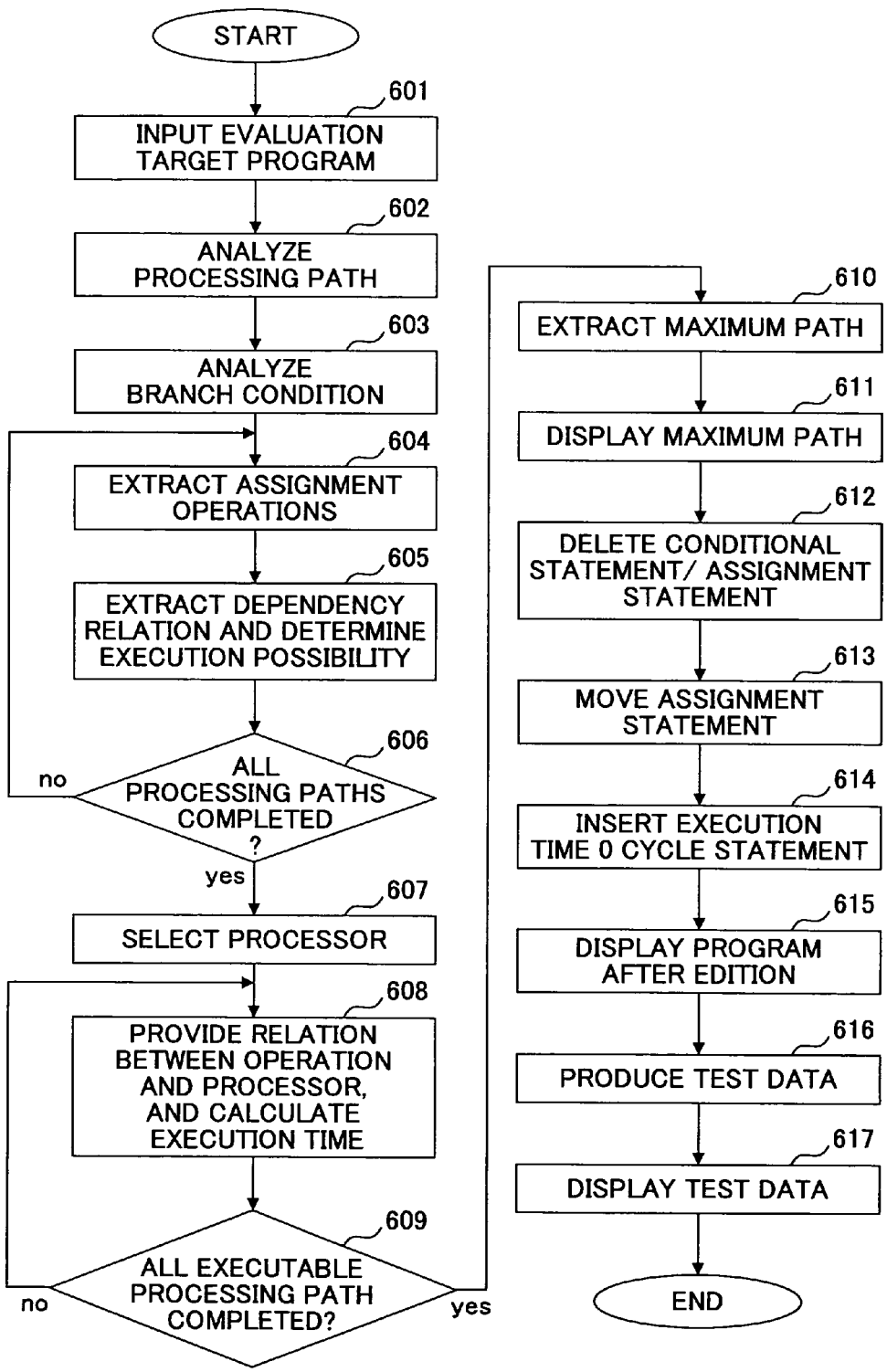
FIG. 7 shows an operation flow chart of required execution time calculation processing for the input program carried out by the software/hardware performance evaluation part in the data processing device designing apparatus according to the embodiment of the present invention.

With reference to FIG. 7, operations of the data processing device designing apparatus described above with reference to FIGS. 1 and 2 are described next in details. FIG. 3 shows an example of the program 102 to be evaluated, and FIG. 4 shows the program shown in FIG. 3 in a form of a flow chart.

In Step 601 of FIG. 7, in the above-mentioned structure analysis part 103, a structure of the program 102 to be evaluated, produced by the user and input thereto via the input device such as a keyboard is analyzed. There, two types of analysis, i.e., analysis for calculating the required execution time and analysis for calculating the required circuit size are carried out. The structure analysis for calculation of the required execution time is carried out in the following three steps (1), (2) and (3):

(1) Processing Path Analyzing step 602:

In this step 602, after the evaluation target program 102 is input, analysis is carried out as to which processing path (a flow of the program) occurs as a result of branching action according to a conditional statement such as an 'if' statement, a 'switch' statement or such.

In the example shown in FIG. 4, the following total six processing paths, passing through respective steps, shown in FIG. 4, may occur:

Start→301→302→303→308→309→End;
Start→301→302→303→308→310→End;
Start→301→304→305→306→307→308→309→End;
Start→301→304→305→306→307→308→310→End;
Start→301→304→305→306→308→309→End; and
Start→301→304→305→306→308→310→End (2) Branch Condition Analysis Step 603:

In this step, the contents of the condition statement such as an 'if' statement, a 'switch' statement or such included in the input program is analyzed. Specifically, analysis is carried out to determine which value of a variable results in that the relevant condition becomes true or false.

In the example of FIG. 4, the following analysis results are obtained: a condition of Step 301 becomes true when a variable 'a' has 0; a condition of Step 306 becomes true when a variable 'c' has 9 or more; and a condition in Step 308 becomes true when a variable 'b' has 0.

(3) Execution Possibility Step:

In this step, from the results of the above-mentioned processing path analysis step (1) and branch condition analysis step (2), it is determined whether or not once extracted processing path is actually executable. This determination step includes the following three steps (1), (2) and (3):

(1) Assignment Operation Extraction Step 604.

In this step 604, it is determined which assignment operation is carried out for a variable along each processing path. For example, in the above-mentioned processing path 'Start→301→302→303→308→309→End', the following extraction result is obtained: '0 is assigned to the variable 'b'; 0 is assigned to the variable 'c'; and an addition result between a variable 'e' and a variable 'f' is assigned to a variable 'd''

(2) Dependency Relationship Extraction and Execution Possibility Determination Step 605:

In this step 605, dependency relationship between the branch condition (the result of the above-mentioned branch condition analysis step) and the result of the above-mentioned (1) assignment operation extraction step is determined, and thus, it is determined whether or not the relevant processing path is actually executable.

For example, the above-mentioned processing path 'Start 301→302→303→308→310→End' includes two branch conditions, i.e., Steps 301 and 308; and, the condition in Step 301 has no assignment from which the relevant condition depends, as a result of the above-mentioned assignment operation extraction step along the relevant path. As a result, it is determined that the condition of Step 301 should branch to a true path (301→302). On the other hand, as to the branch condition of Step 308, it is determined that this condition is determined after 0 is assigned to the variable 'b' (according to the above-mentioned assignment operation extraction step and the above-mentioned dependency relationship extraction step), and also, the above-mentioned assignment of 0 to the variable 'b' results in unfulfilment of the condition ('b' should be other than '0') so that the relevant processing path may not occur actually (301→310). As a result, it is logically determined that the condition of Step 308 cannot branch to the false path (308→310). Consequently, the relevant processing path is non-executable.

(3) The Above-mentioned Processing of (1) and (2) is Carried Out For All the Above-mentioned Processing Paths (Step 606).

In the above-mentioned example of FIG. 4, the following results are thus obtained:

Start→301→302→303→308→309→End: Executable;
Start→301→302→303→308→310→End: Non-executable;
Start→301→304→305→306→307→308→309→End: Non-executable;
Start→301→304→305→306→307→308→310→End: Executable;
Start→301→304→305→306→308→309→End: Non-executable; and
Start→301→304→305→306→308→310→End: Executable In the processor selection part 104, as mentioned above, from among a plurality of processors previously registered, a processor used as a target currently is selected by the user with the use of the input device such as a mouse (processor selection step 607). It is noted that, for each processor registered, correspondence relationship between variable types of operations which may occur in a program, i.e., a conditional statement, an assignment statement or such, and execution times each required for actually executing a respective one of these types of operations are also registered, as shown in FIGS. 5A-5C. FIGS. 5A-5C illustrate one example of the registered data for each processor registered.

If a desired processor is not yet registered, the user may newly register the processor, as a result of editing already registered processor data, or newly creating relevant processor data.

In the path extraction part 105, the result from the structure analysis part 103 and the result from the processor selection part 104 are input, and a path with which the required execution time taken becomes maximum is extracted. This execution time maximizing path extraction operation includes the following three steps (1), (2) and (3):

(1) Providing Relationship Between Operation and Processor, and Execution Time Calculation Step 608:

For each of the respective executable processing path obtained in the structure analysis part 103, the registered execution time for each relevant operation of the relevant processor selected in the processor selection part 104 is applied to each relevant operation appearing along the relevant processing path such as a condition statement, an assignment statement or such also obtained in the structure analysis part 103. Thus, the relevant registered required execution times are applied to the respective operations included in the relevant processing path, and thus, a total required execution time is calculated for each of the relevant processing paths.

For example, in a case where an 'A' company processor A1 shown in FIG. 5A is selected, a total required execution time of the processing path 'Start→301→302→303→308→309→End' of the example of FIG. 4 mentioned above is obtained as follows:

Step 301 ('determination as to whether or not a variable has a predetermined integer': int==const): 3 cycles;
Step 302 ('assignment of integer'; int=const): 1 cycle;

Step 303 ('assignment of integer'; int=const): 1 cycle;

Step 308 ('determination as to whether or not a variable has a predetermined integer': int==const): 3 cycles;

Step 309 ('assignment of sum of integers'; int=int+int): 2 cycles;

As a result, the total required execution time for processing along the processing path is obtained as follows:

$$3+1+1+3+2=10 \text{ [cycles]}$$

(2) The Above-mentioned Processing (1) is Carried Out For Each of All the Executable Processing Paths Obtained in the Structure Analysis Part 103 (Step 609).

For example, assuming that the 'A' company processor A1 (FIG. 5A) is selected in the processor selection part 104 as mentioned above, in the example of FIG. 4, the following calculation results are obtained in the same way:

Start→301→302→303→308→309→End: 10 cycles;

Start→301→304→305→306→307→308→310→End: 18 cycles; and Start→301→304→305→306→308→310→End: 17 cycles (3) From among the respective required execution times thus obtained for all the executable processing paths, the processing path (required execution time maximizing path) in which the required execution time becomes maximum is extracted (Step 610). For example, in a case where the 'A' company processor A1 is selected in the processor selection part 104 the same as the above, the required execution time maximizing path is the path of 'Start→301→304→305→306→307→308→310→End' (18 cycles). Further, in this case, the required execution time is 18 cycles.

The required execution time (execution time 110) thus extracted in the path extraction part 105 is displayed on an output device such as a display device (Step 611).

Then, the program editing part 106 edits the input program so that the required execution time may become coincident with the above-mentioned required execution time of the required execution time maximizing path obtained as mentioned above. This program editing operation includes the following three steps (1), (2) and (3);

(1) Conditional Statement/assignment Statement Deletion Step 612:

The conditional statement/assignment statement appearing in the paths other than the above-mentioned required execution time maximizing path included in the input program, extracted in the path extraction part 105, are deleted. For example, in the example of FIG. 4, assuming that the required execution time maximizing path is the path of 'Start→301→302→303→308→309→End' for the sake of simplification of description, the conditional statement of Step 306 (line 11 in FIG. 13) is deleted; and the assignment statements of Steps 304, 305, 307 and 310 (lines 8, 9, 12 and 20 in FIG. 3, respectively) are also deleted.

(2) Assignment Statement Moving Step 613:

For each of all the assignment statements included in the required execution time maximizing path extracted in the path extracting part 105, when a condition exists to be determined before execution of the relevant assignment statement, the assignment statement is moved to the outside of the relevant conditional statement so that the relevant assignment statement may be executed without depending on the determination result of the relevant condition. At this time, however, the execution order of the conditional statements, the assignment statements and so forth should not be changed.

For example, assuming that the required execution time maximizing path is the path of 'Start→301→302→303→308→309→End' in the example of FIG. 4, the assignment statements of Steps 302, 303 and 309 (lines 4, 5 and 17, respectively, in FIG. 3) are included. Thereamong, each of those of Steps 302 and 303 depends from the condition of Step 301 (that is, they are executed only when the result of Step 301 is true). Therefore, these steps are moved to the outside of the relevant conditional statement so that they may be executed without depending on the determination result of the conditional step 301. That is, the relevant steps are moved outside from the scope which is executed only when the conditional statement 301 has the true determination result so that these steps 302 and 303 may be executed without depending on the result of the conditional statement 301 (see lines 6-7 of FIG. 6). Further, since Step 309 depends on the conditional step 308 (that is, it is executed only when Step 308 has the true result), the assignment statement of Step 309 is moved outside of the relevant conditional statement 308 so that it may be executed without depending on the result of the conditional step 308 (see line 12 of FIG. 6).

(3) Execution Time 0 Cycle Inserting Step 614:

A statement having an execution time of 0 is inserted in each of all the conditional statements included in the required execution time maximizing path extracted in the path extracting part 105. The statement having the execution time of 0 acts as a dummy to be inserted for the purpose of keeping the original load of each conditional statement unchanged which would be otherwise changed since the assignment statement is removed from the conditional statement in the above-mentioned assignment statement moving step 613. That is, assuming that the required execution time maximizing path is the path of 'Start→301→302→303→308→309→End' in the example of FIG. 4, the conditional statements of Steps 301 and 308 (corresponding to lines 3 and 16 in FIG. 3, respectively) are included. Then, in each of these steps, an in-line assembler comment (i.e., the statement having the execution time of 0) is inserted (corresponding to lines 4 and 10 of FIG. 6, respectively).

The program (program 111) thus edited in the program editing part 106 is displayed on the output device such as a display device (Step 615).

Then, the test data generation part 107 generates input data causing the program to be executed in such a manner of passing through the required execution time maximizing path extracted in the path extraction part 105, automatically. This test data (input data) is generated in such a manner that each of all the statements included in the required execution time maximizing path may branch to the side of the maximizing path (Step 616) as a result of the dependency relationship between the branch condition and the assignment operation being analyzed for each of all the conditional statements included in the required execution time maximizing path extracted in the structure analysis part 103.

For example, assuming that the required execution time maximizing path is the path of 'Start→301→304→305→306→307→308→310→End' in the example of FIG. 4, the following results are obtained from the extraction of the structure analysis part 103:

assignment statement from which the conditional step 301 depends: non;

assignment statement from which the conditional step 306 depends: 305; and assignment statement from which the conditional step 308 depends: 304.

Therefore, the input data (test data) which causes each conditional statement to branch to the side of the required execution time maximizing path is obtained for each conditional statement as follows:

for conditional step 301: a=1;
for conditional step 306: c=8; and
for conditional step 308: b=(any value)

Since the variable 'c' is incremented in Step 305, the above-mentioned 'c=8' becomes 'c=9'. As a result, in Step 306, the conditional statement of whether 'c' is not less than 9 has a determination result of true. As a result, branch to Step 307 occurs. Then, in Step 308, the conditional statement of whether 'b' has 0 has a determination result of false since, even if 'b' has 0 originally, 1 is assigned thereto in Step 304. As a result, branch to Step 310 occurs there.

The test data (automatically generated test data 112) thus obtained in the test data generation part 107 is displayed on the output device such as a display device (Step 617).

Figure 9:
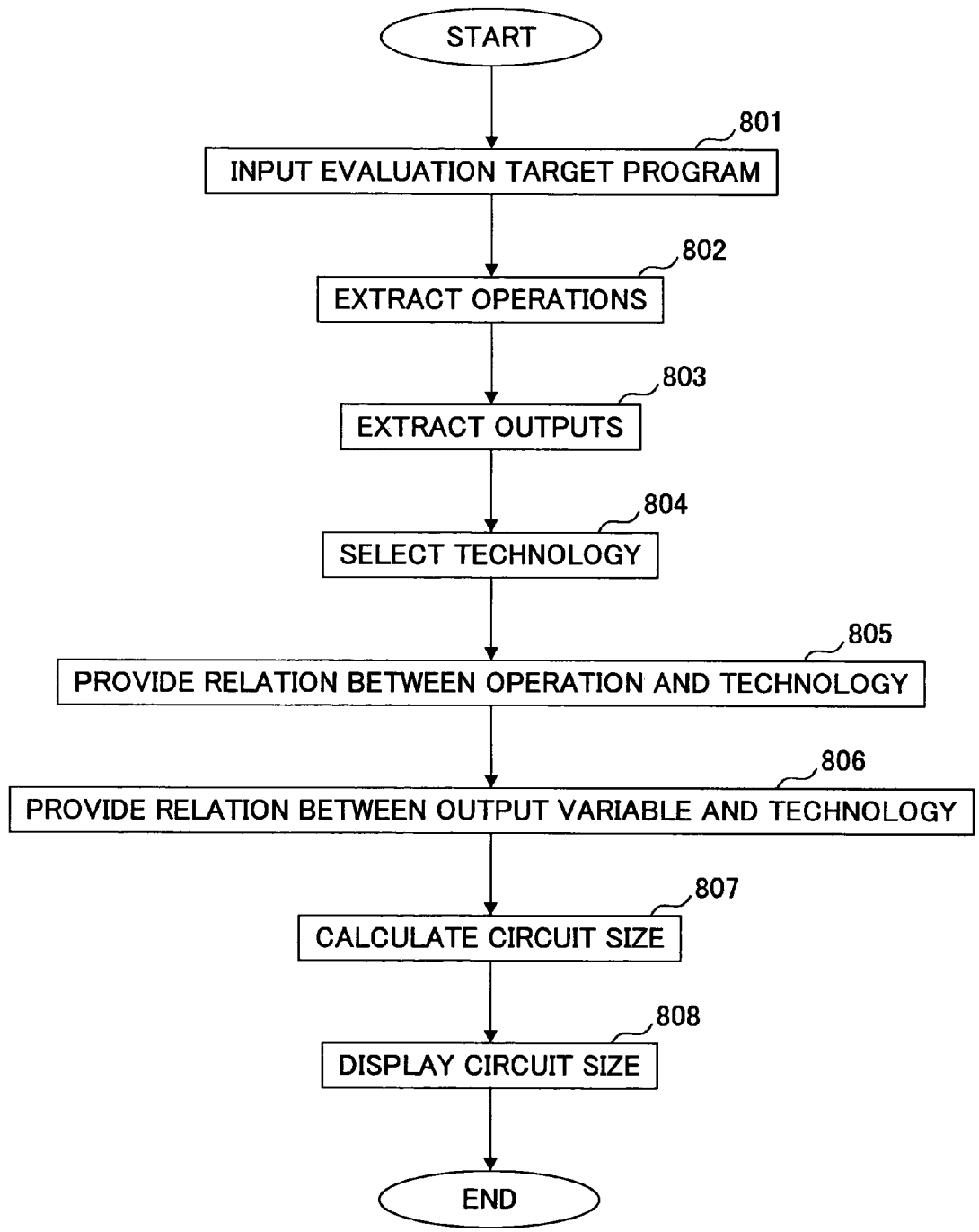
FIG. 9 shows an operation flow chart of required circuit size calculation processing for the input program carried out by the software/hardware performance evaluation part in the data processing device designing apparatus according to the embodiment of the present invention.

Next, the above-mentioned structure analysis for calculating a circuit size of hardware includes the following two steps (1) and (2):

(1) Operation Extraction Step 802:

In FIG. 9, after the evaluation target program 801 is input, operations included in this input program, types of the operations and occurrence times of the respective types of operations are extracted. In the example of FIG. 4, the following extraction results are obtained:

comparison as to whether or not an int-type variable is coincident with a constant: Steps 301 and 308;

assignment of a constant to an int-type variable: Steps 302, 303, 304 and 308;

addition of 1 to an int-type variable: Step 305;

comparison in magnitudes between an int-type variable and a constant: Step 306;

assignment of a result of addition between an int-type variable and an int-type variable into an int-type variable: Step 309; and assignment of a result of multiplication between an int-type variable and an int-type variable into an int-type variable: Step 310

(2) Output Extraction Step 803:

From the input program, the number of variables corresponding to outputs and a type of each thereof are summed up.

In the example of FIG. 4, variables 'b', 'c' and 'd' correspond to the outputs of the program, and a type of each thereof is an int-type (integer type). As a result, each has 32 bits for example.

In the technology selection part 108, according to the user's input operation made with the use of an input device such as a mouse, a hardware technology applied currently is selected from among a plurality of technologies of hardware previously registered (technology selection step 804). Data registered for each technology of hardware includes a relation between each of variable types of operations which may occur in a conditional statement or an assignment statement of a program or variables corresponding to outputs of the program and a circuit size required when the relevant operation or variable is realized in a form of hardware. FIGS. 8A-8C show an example thereof.

If a desired hardware technology has not been registered yet, the user may edit an already registered technology to newly register the desired technology or may newly cerate the same to be registered.

The circuit size calculation part 109 calculates a required circuit size of hardware based on the analysis result of the structure analysis part 103 and the selection result of the technology selection part 108 input thereto. This calculation includes the following three steps (1), (2) and (3):

(1) Operation and Technology Relation Determination Step 805:

For each operation extracted from the input program by the structure analysis part 103, a circuit size required when the operation is realized in a form of hardware is obtained from among data of the hardware technology selected by the technology selection part 108. Then, the thus-obtained circuit size is multiplied with the number of times of occurrence of the relevant type of operation, and thus, a total circuit size required for the relevant type of operations occurring in the program is summed up.

For example, assuming that an 'A' company 0.18 μm technology shown in FIG. 8A is selected, the circuit size required for the above-mentioned 'comparison as to whether or not an int-type variable is coincident with a constant: Steps 301 and 308' is calculated as follows:

300 (int==constant)×2 (occurrence times)=600 [gates]

Calculation is carried out in the same way for each of all the types of operations included in the program.

(2) Output Variable and Technology Relation Determination Step 806:

For each of the variables corresponding to the outputs of the program extracted in the structure analysis part 103, a circuit size required when the variable corresponding to the output is realized in a form of hardware is obtained from among the data of the hardware technology selected by the technology selection part 108. Then, the thus-obtained circuit size is multiplied with a predetermined constant determined according to the particular type of the variable corresponding to the output (for example, 32 bits for the case of int-type). Thus, a total circuit size required for the relevant variable occurring in the program is obtained.

For example, assuming that an 'A' company 0.18 μm technology shown in FIG. 8A is selected, the circuit size required for the above-mentioned 'the variable 'b' corresponding to the output' is calculated as follows:

10 (FFs)×32 (constant determined for the variable type)=320 [gates]

It is noted that 'FF' means a flip-flop device. Calculation is carried out in the same way for each of the variables corresponding to all the outputs of the program.

(3) Circuit Size Calculation Step 807:

The required circuit sizes obtained for the respective types of operations included in the input program and the required circuit sizes obtained for the respective variables corresponding to the outputs included of the input program, calculated in the above-mentioned steps (1) and (2), are summed up. Thereby, the circuit size required when functions of the input program are realized in a form of hardware is calculated.

The required circuit size (circuit size 113) thus calculated in the circuit size calculating part is displayed on an output device such as a displayed device (Step 808).

Figure 10:
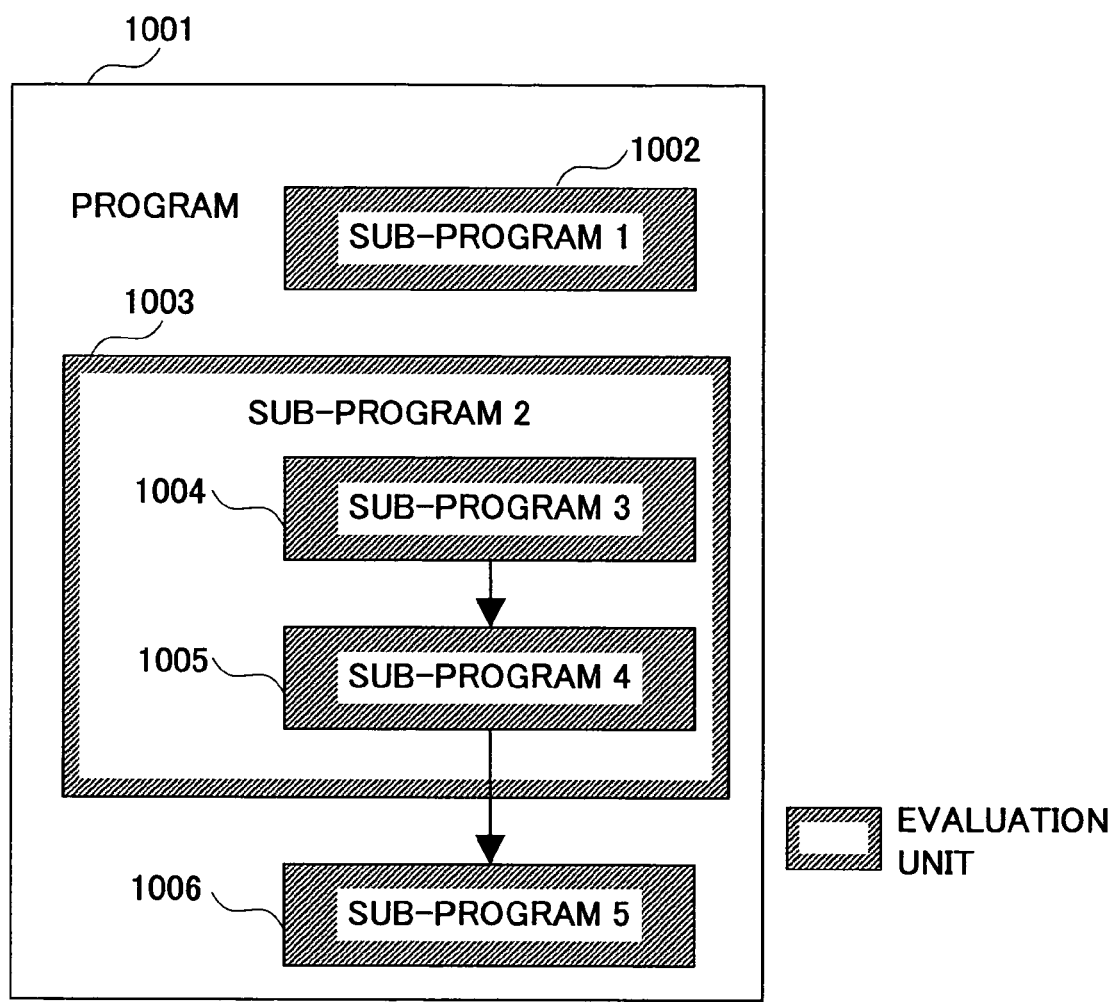
FIG. 10 shows one example of the input program for the data processing device designing apparatus according to the embodiment of the present invention.

FIG. 10 shows an example of the evaluation target program 902. Generally, a program (1001) includes a plurality of sub-programs (1002, 1003 and 1006), as shown. Further, the sub-program may further include a plurality of sub-programs (1004 and 1005). The program 102 as the evaluation target program may be a main program such as the program 1001 shown, or, a sub-program of the main program 1001 such as the program 1002. Further alternatively, it may be a further sub-program of another sub-program, such as the program 1004.

In the evaluation unit determination part 903, a structure of the evaluation target program 902 given by the user and input via an input device such as a keyboard is analyzed, and, then, from the thus-obtained analysis result, the user determines a program unit (evaluation unit) to be input to the software/hardware performance evaluation part 904. This processing includes the following steps (1) and (2):

(1) Hierarchy Structure Analysis Step 1102:

In the structure analysis, calling/to-be-called relationship is extracted, thus it is determined what sub-programs are included in the input program (program's hierarchy structure). In the example of FIG. 10, the structure analysis and extraction result is that the entire program 1001 includes the sub-program 1002, 1003 and 1006, and further, the sub-program includes the sub-program 1004 and 1005, as shown.

(2) Evaluation Unit Determination Step 1103:

Based on the hierarchy structure extraction result obtained in the above-mentioned step (1), the user determines a program unit to be input to the software/hardware performance evaluation part 904. In this case, the user may select, as a program unit, any one of the entire program 1001, the sub-program such as that 1004, the further sub-program such as that 1004, and so forth.

In the example of FIG. 10, software/hardware performance analysis for the unit of the main program 1001; software/hardware performance analysis for each of the respective units of the sub-program 1002, 1003, 1006; or software/hardware performance analysis for each of the respective units of the sub-programs 1002, 1003, 1004, 1005 and 1006 may be carried out.

The software/hardware performance analysis part 904 repetitively carries out performance analysis for each of the program units determined via the evaluation unit determination part 903 according to the processing scheme described above with reference to FIGS. 7 and 9, and thus, carries out performance evaluation for each of all the designated evaluation units in sequence (Step 1105).

On the other hand, the user inputs a restriction of the required execution time of the part realized in a form of software executed by a processor and a restriction of the required circuit size of the part functions of which are realized in a form of hardware such as an ASIC, via an input device such as a keyboard (Step 1106).

As the restriction requirements input in this case are, for example, the required execution time: not more than 10000 cycles; and the required circuit size: not more than 30000 gates (see FIG. 13).

The dividing plan calculation part 906 sums up the performance evaluation results of the software/hardware performance evaluation part 904, and extracts a software/hardware function dividing plan fulfilling the restriction requirements given in the restriction input part 905 as mentioned above. This processing includes the following two steps (1) and (2):

(1) Performance Evaluation Result Sum Up Step 1107:

The respective values of the required execution times 110 and the required circuit sizes 113 as the processing results of the software/hardware performance evaluation part 904 are summed up in sequence for the respective ones of the program unit designated in the evaluation unit determination part 903 for all those evaluation units. In the example of FIG. 10, assuming that the evaluation units are designated as 'the sub-programs 1002, 1003 and 1006', for example, the following sum up results are obtained for these respective evaluation units (see FIGS. 12A-12C and 14):

1002: the required execution time of 3000 cycles; and the required circuit size of 10000 gates;

1003: the required execution time of 6000 cycles; and the required circuit size of 22000 gates;

1006: the required execution time of 5000 cycles; and the required circuit size of 5000 gates (2) Restriction Fulfillment Determination Step 1108:

From the above-mentioned sum up results of the step (1), a software/hardware function dividing plan fulfilling the restriction requirements given in the restriction input part 905 is calculated. Specifically, from among the all possible combinations of software/hardware (in the above-mentioned example, total 8 combinations are available as shown in FIG. 15), it is determined, some of these combinations, which are necessary (or, for all the combinations), whether or not the combination satisfies the restrictions, in sequence.

Assuming that, in the example of FIG. 10, the evaluation units are designated as '1002, 1003 and 1006' and the sum up results as below are obtained the same as the above:

1002: the required execution time of 3000 cycles; and the required circuit size of 10000 gates;

1003: the required execution time of 6000 cycles; and the required circuit size of 22000 gates;

1006: the required execution time of 5000 cycles; and the required circuit size of 5000 gates, the following software/hardware combinations are obtained from among the 8 combinations shown in FIG. 15, as satisfying the above-mentioned restriction requirements (corresponding to those enclosed by hatching in FIG. 15):

in a case where 1002 is configured by software while 1003 and 1006 are configured as hardware, the total required execution time: 3000 cycles and the total required circuit size: 27000 gates;

in a case where 1003 is configured by software while 1002 and 1006 are configured as hardware, the total required execution time: 6000 cycles and the total required circuit size: 15000 gates;

in a case where 1002 and 1003 are configured by software while 1006 is configured as hardware, the total required execution time: 9000 cycles an the total required circuit size: 5000 gates; and in a case where 1002 and 1006 are configured by software while 1003 is configured as hardware, the total required execution time: 8000 cycles and the total required circuit size: 22000 gates.

These dividing plans (software/hardware function dividing pan 907) are displayed on an output device such as a display device (Step 1109).

If the user wishes to obtain evaluation results for another processor or another technology, and to obtain software/hardware function dividing planes therefor (Yes in Step 1110), then the software/hardware performance evaluation step 1104 is returned to, and then, in Steps 1104, 1105, 1106, 1107, 1108 and 1109, evaluation may be carried out in the same way. FIGS. 16-19 illustrate an example of evaluation in a case where a 'B' company processor B2 and an 'A' company 0.18 μm technology are applied. FIGS. 16, 17, 18 and 19 correspond to FIGS. 12A-12C, 13, 14 and 15, respectively.

Then, the user may consider given development period or development costs totally so as to select a bast plan from among the thus-obtained plurality of hardware/software dividing plans where the plurality of different processors or the plurality of different hardware technologies are applied, respectively. Thus, the user can carry out evaluation study for the optimum manner of processor/technology selection and the optimum manner of software/hardware function dividing, in parallel at the same time.

Thus, according to the present invention, (1) unlike the prior art, it is not necessary to edit a target program to specialize it for a particular processor to be applied, but it becomes possible to carry out comparison among respective cases where a plurality of different processors are applied, rapidly. (2) Further, unlike the prior art, it is not necessary to modify description of the program to specialize it for a particular function compiling tool applied for carrying out calculation of a required circuit size. Thus, it becomes possible to carry out comparison among respective cases where a plurality of different technologies are applied, rapidly.

Furthermore, thanks to the above-mentioned functions (1) and (2), it becomes possible to carry out the processor/technology selection and the software/hardware function dividing in parallel. Thereby, it is possible to avoid returning to a previous step such as again to carry out processor/technology selection repetitively, which may occur in the prior art.

Furthermore, according to the present invention, two alternative functions are prepared, i.e., a function of editing the program so that the execution time may become equal to the case where the processing path resulting in that the execution time becomes maximum, and another function of automatically producing test data by which the given program is executed passing through the processing path resulting in that the required execution time becomes maximum, it becomes possible to select an effective way to calculate the required execution time by selecting one of both functions appropriately depending on each particular development stage. Accordingly, it is possible to calculate the required execution time in simulation rapidly without producing the teat data according to the first alternative function.

Figure 11:
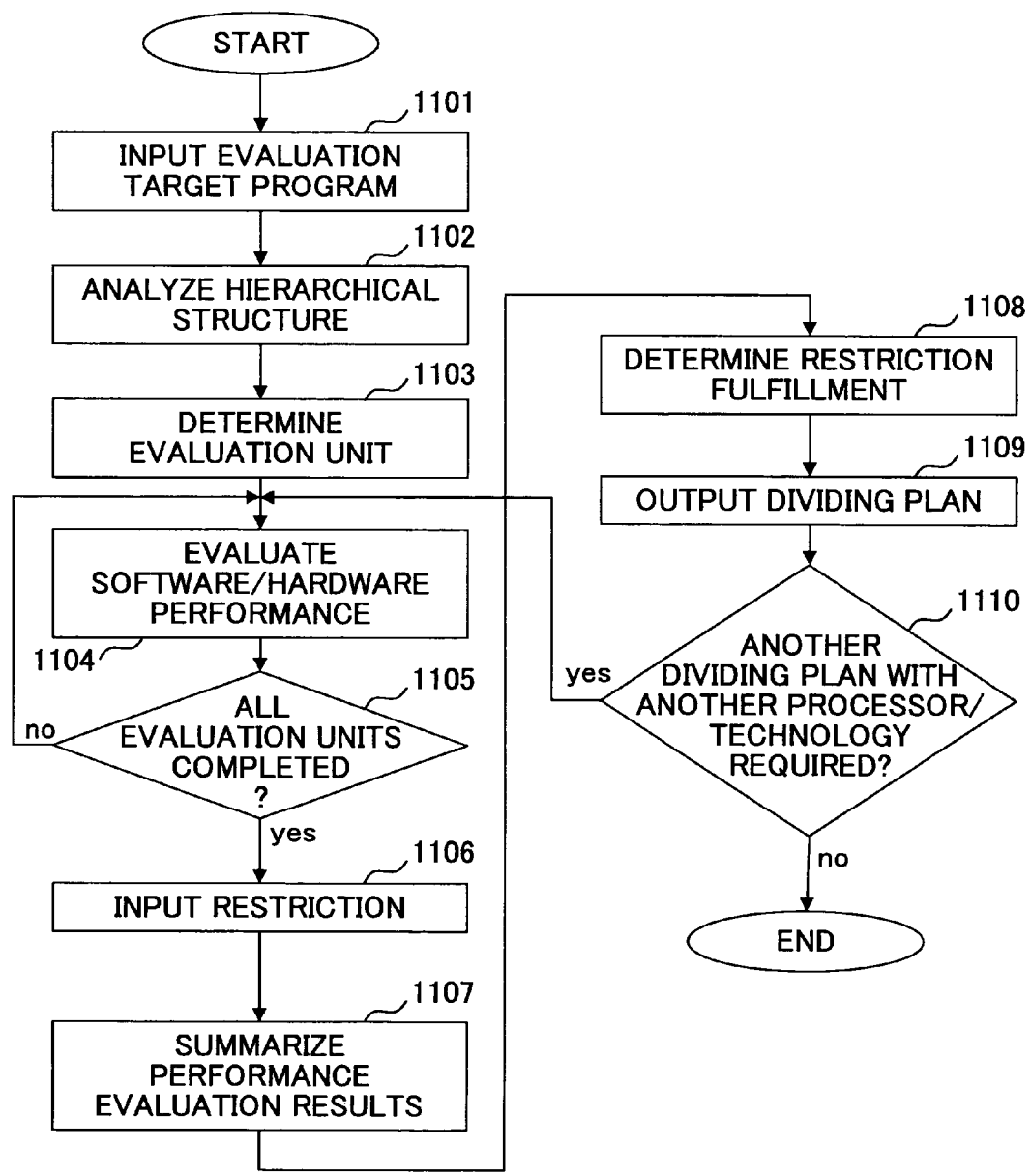
FIG. 11 shows an operation flow chart of software/hardware function dividing processing carried out by the data processing device designing apparatus according to the embodiment of the present invention.

It is noted that the software/hardware performance evaluation part 101 shown in FIG. 1 and the data processing device designing apparatus 901 including the software/hardware performance evaluation part 101 may be configured as a result of, for example, a program including instructions for causing a computer to execute the operations described above with reference to FIGS. 7, 9 and 11 being installed in the computer, and then, the program being executed by a CPU and an accompanying memory included in the computer cooperatively. At this time, the program installed in the computer may be loaded thereto via a carriable information recording medium such as a CD-ROM, or, may be loaded thereto via a communication network such as the Internet, LAN or such.

Further, the present invention is not limited to the above-described embodiment, and variations and modifications may be made without departing from the basic concept of the present invention claimed below.

The present application is based on Japanese priority application No. 2004-049955 filed on Feb. 25, 2004, the entire contents of which are hereby incorporated herein by reference.

What is claimed is:

1. A data processing device designing method of dividing a predetermined program comprising instructions for a plurality of operations, into a first part which is executed by a predetermined processor and a second part, functions of which are realized in hardware according to a predetermined technology, and thus designing a data processing device corresponding to the predetermined program, comprising the steps of:
 a) previously calculating an execution time required when each predetermined operation is executed by the predetermined processor;
 b) previously calculating a circuit size required when each predetermined operation is realized in hardware according to the predetermined technology;
 c) calculating, for operations included in each sub-program of the first part of the predetermined program, a total execution time required when each sub-program of the first part of the predetermined program is executed by the predetermined processor, by using the previously calculated required execution time obtained for the predetermined operation for the predetermined processor; and
 d) calculating, for operations included in each sub-program of the second part of the predetermined program, a total circuit size required when functions of each sub-program of the second part of the predetermined program are realized in hardware according to the predetermined technology, by using the previously calculated required circuit size obtained for each predetermined operation for the predetermined technology, and thus, designing the data processing device corresponding to the predetermined program in such a manner that predetermined circuit designing requirements comprising a predetermined required execution time and a predetermined required circuit size may be fulfilled.

2. The data processing device designing method as claimed in claim 1, further comprising the step of:
 e) editing the program in such a manner that the predetermined program may be executed in a predetermined processing path corresponding to the execution time, calculated in said step c), required when the predetermined program is executed by the predetermined processor, carrying out simulation of executing the predetermined program with the use of the thus-edited program, or producing test data such that therewith the predetermined program may be executed in a predetermined processing path corresponding to the execution time, calculated in said step c), required when the predetermined program is executed by the predetermined processor, carrying out simulation of executing the predetermined program with the use of the thus-produced test data.

3. A data processing device designing apparatus configured to divide a predetermined program comprising instructions for a plurality of operations, into a first part which is executed by a predetermined processor and a second part, functions of which are realized in hardware according to a predetermined technology, and thus designing a data processing device having the same functions as those of the predetermined program, the apparatus comprising a storage unit storing a program, and an operation unit reading the program from the storage unit and operating as each portion by executing the program, and comprising:
 a first portion configured to previously calculate an execution time required when each predetermined operation is executed by the predetermined processor;
 a second portion configured to previously calculate a circuit size required when each predetermined operation is realized in hardware according to the predetermined technology;
 a third portion configured to calculate, for operations included in each sub-program of the first part of the predetermined program, a total execution time required when each sub-program of the first part of the predetermined program is executed by the predetermined processor, by using the previously calculated required execution time obtained for the predetermined operation for the predetermined processor; and
 a fourth portion configured to calculate, for the operations included in each sub-program of the second part of the predetermined program, a total circuit size required when functions of each sub-program of the predetermined program are realized in hardware according to the predetermined technology, by using the previously calculated required circuit size obtained for each predetermined operation for the predetermined technology, and thus, designing the data processing device corresponding to the predetermined program in such a manner that predetermined circuit designing requirements comprising a predetermined required execution time and a predetermined required circuit size may be fulfilled.

4. The data processing device designing apparatus as claimed in claim 3, further comprising:
   a fifth portion configured to edit the program in such a manner that the predetermined program may be executed in a predetermined processing path corresponding to the execution time, calculated by said third portion, required when the predetermined program is executed by the predetermined processor, carrying out simulation of executing the predetermined program with the use of the thus-edited program, or producing test data such that therewith the predetermined program may be executed in a predetermined processing path corresponding to the execution time, calculated by said third portion, required when the predetermined program is executed by the predetermined processor, carrying out simulation of executing the predetermined program with the use of the thus-produced test data.

5. A computer readable storage medium storing a data processing device designing program executable by a computer to cause the computer to divide a predetermined program comprising instructions for a plurality of operations, into a first part which is executed by a predetermined processor and a second part functions of which are realized in hardware according to a predetermined technology, and thus designing a data processing device corresponding to the predetermined program, said program comprising instructions for the computer to execute the steps of:
   a) previously calculating an execution time required when each predetermined operation is executed by the predetermined processor;
   b) previously calculating a circuit size required when each predetermined operation is realized in hardware according to the predetermined technology;
   c) calculating, for operations included in each sub-program of the first part of the predetermined program, a total execution time required when each sub-program of the first part of the predetermined program is executed by the predetermined processor, by using the previously calculated required execution time obtained for the predetermined operation for the predetermined processor; and
   d) calculating, for the operations included in each sub-program of the second part of the predetermined program, a total circuit size required when functions of each sub-program of the second part of the predetermined program are realized in hardware according to the predetermined technology, by using the previously calculated required circuit size obtained for each predetermined operation for the predetermined technology, and thus, designing the data processing device corresponding to the predetermined program in such a manner that predetermined circuit designing requirements comprising a predetermined required execution time and a predetermined required circuit size may be fulfilled.

6. The computer readable storage medium storing the data processing device designing program as claimed in claim 5, further comprising instructions for causing the computer to execute the step of:
   e) editing the program in such a manner that the predetermined program may be executed in a predetermined processing path corresponding to the execution time, calculated in said step c), required when the predetermined program is executed by the predetermined processor, carrying out simulation of executing the predetermined program with the use of the thus-edited program, or producing test data such that therewith the predetermined program may be executed in a predetermined processing path corresponding to the execution time, calculated in said step c), required when the predetermined program is executed by the predetermined processor, carrying out simulation of executing the predetermined program with the use of the thus-produced test data.

7. A computer readable information recording medium storing therein the data processing device designing program claimed in claim 5.

8. A computer readable information recording medium, storing therein the data processing device designing program claimed in claim 6.

* * * * *